United States Patent
Wang et al.

(10) Patent No.: US 12,200,905 B2
(45) Date of Patent: Jan. 14, 2025

(54) LIQUID COOLING STRUCTURE WITH LOW-FORCE QUICKSEAL JOINTS FOR CARRYING COOLANT, CABINET, AND SERVER

(71) Applicant: Fulian Precision Electronics (Tianjin) Co., LTD., Tianjin (CN)

(72) Inventors: Pao-Ching Wang, New Taipei (TW); Chieh-Hsiang Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 338 days.

(21) Appl. No.: 17/852,689

(22) Filed: Jun. 29, 2022

(65) Prior Publication Data

US 2023/0039526 A1    Feb. 9, 2023

(30) Foreign Application Priority Data

Aug. 5, 2021   (CN) .......................... 202110898303.X

(51) Int. Cl.
   *H05K 7/20* (2006.01)

(52) U.S. Cl.
   CPC ..... *H05K 7/20272* (2013.01); *H05K 7/20218* (2013.01); *H05K 7/20709* (2013.01); *H05K 7/20781* (2013.01)

(58) Field of Classification Search
   CPC ........... H05K 7/20272; H05K 7/20218; H05K 7/20709; H05K 7/20781

USPC .......................................................... 361/699
See application file for complete search history.

(56) References Cited

U.S. PATENT DOCUMENTS

| | | | |
|---|---|---|---|
| 11,690,200 B2 * | 6/2023 | Gao | H05K 7/20781 361/699 |
| 2009/0260777 A1 * | 10/2009 | Attlesey | H01L 23/473 165/104.33 |
| 2015/0208551 A1 * | 7/2015 | Davidson | H05K 7/20781 165/80.2 |
| 2017/0105313 A1 * | 4/2017 | Shedd | H05K 7/20309 |
| 2022/0408606 A1 * | 12/2022 | Gao | H05K 7/20763 |

FOREIGN PATENT DOCUMENTS

| | | | | |
|---|---|---|---|---|
| DE | 102019214722 A1 * | 4/2021 | | H05K 7/20 |
| TW | M464984 U | 11/2013 | | |
| TW | 202023350 A | 6/2020 | | |

* cited by examiner

*Primary Examiner* — Zhengfu J Feng
(74) *Attorney, Agent, or Firm* — ScienBiziP, P.C.

(57) ABSTRACT

A liquid cooling structure for a server with low-force quickseal joints to carry the coolant includes a first support, a first joint, a second support, a second joint, a first magnet, and a second magnet. The first support is set on the cabinet body. The second support is set on the server body. The first joint is set on the first support. The second joint is arranged on the second support and can be coupled with the first joint. The first magnet is set on first support. The second magnet is set on second support. The first magnet and second magnet with opposite magnetism attract each other to reduce the amount of force required for coupling the first joint and the second joint, and is labor-saving.

17 Claims, 6 Drawing Sheets

LIQUID COOLING STRUCTURE WITH LOW-FORCE QUICKSEAL JOINTS FOR CARRYING COOLANT, CABINET, AND SERVER

FIELD

The subject matter herein generally relates to liquid cooling structures for cooling servers.

BACKGROUND

Liquid cooling is an effective cooling method for heating elements in a server. For example, one quickseal joint is set on a server body of the server, and other quickseal joint is set on a cabinet body. The one quickseal joint is connected with the other quickseal joint. The liquid can be input into the cabinet body to cool the heating elements in the server via the two quickseal joints. The quickseal joint has a built-in spring, and the two joints are lockable by the spring. The elastic force of the spring needs to be overcome when the two joints are brought together, and coupling the two quickseal joints is laborious.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
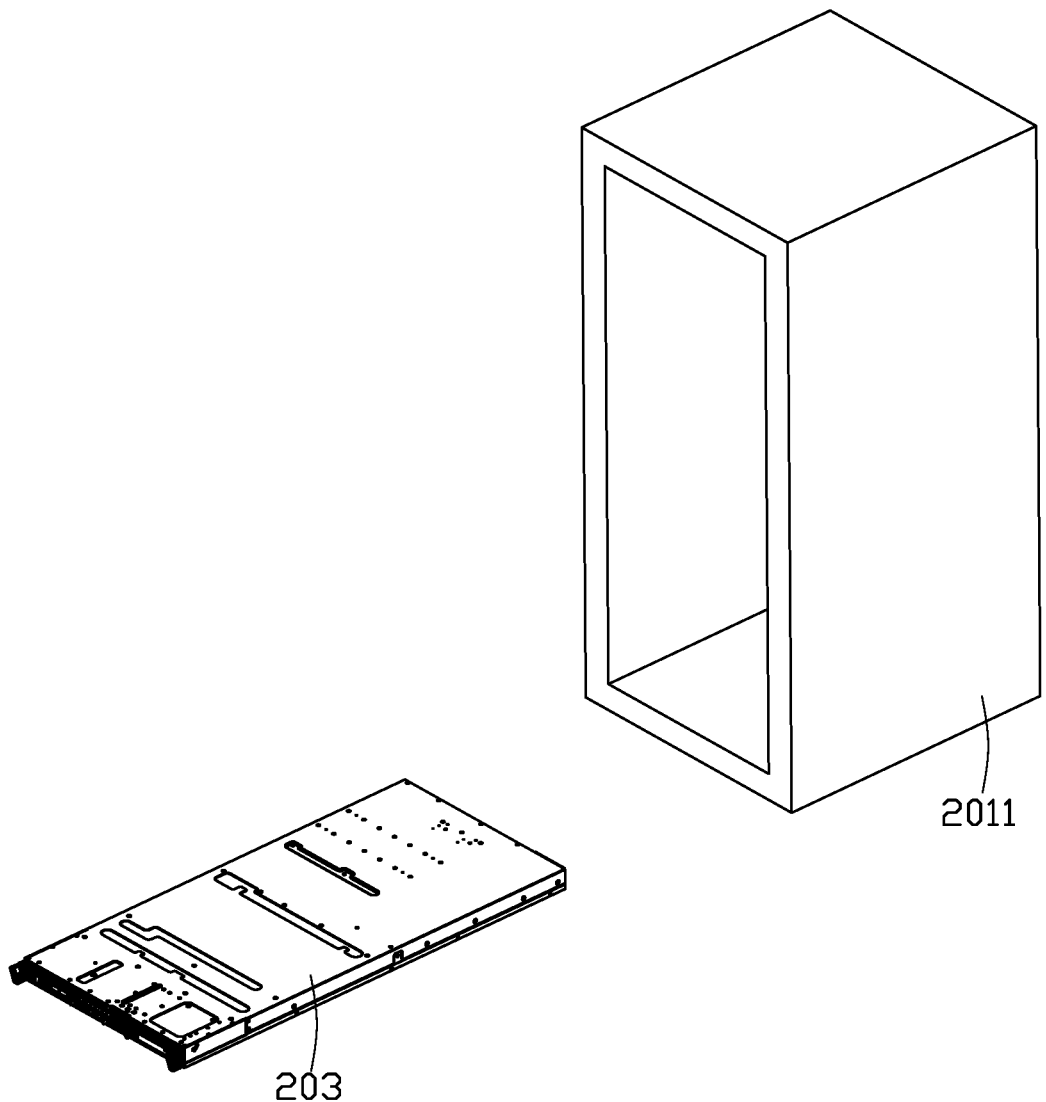
FIG. 1 is an isometric, exploded view of a server provided by an embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
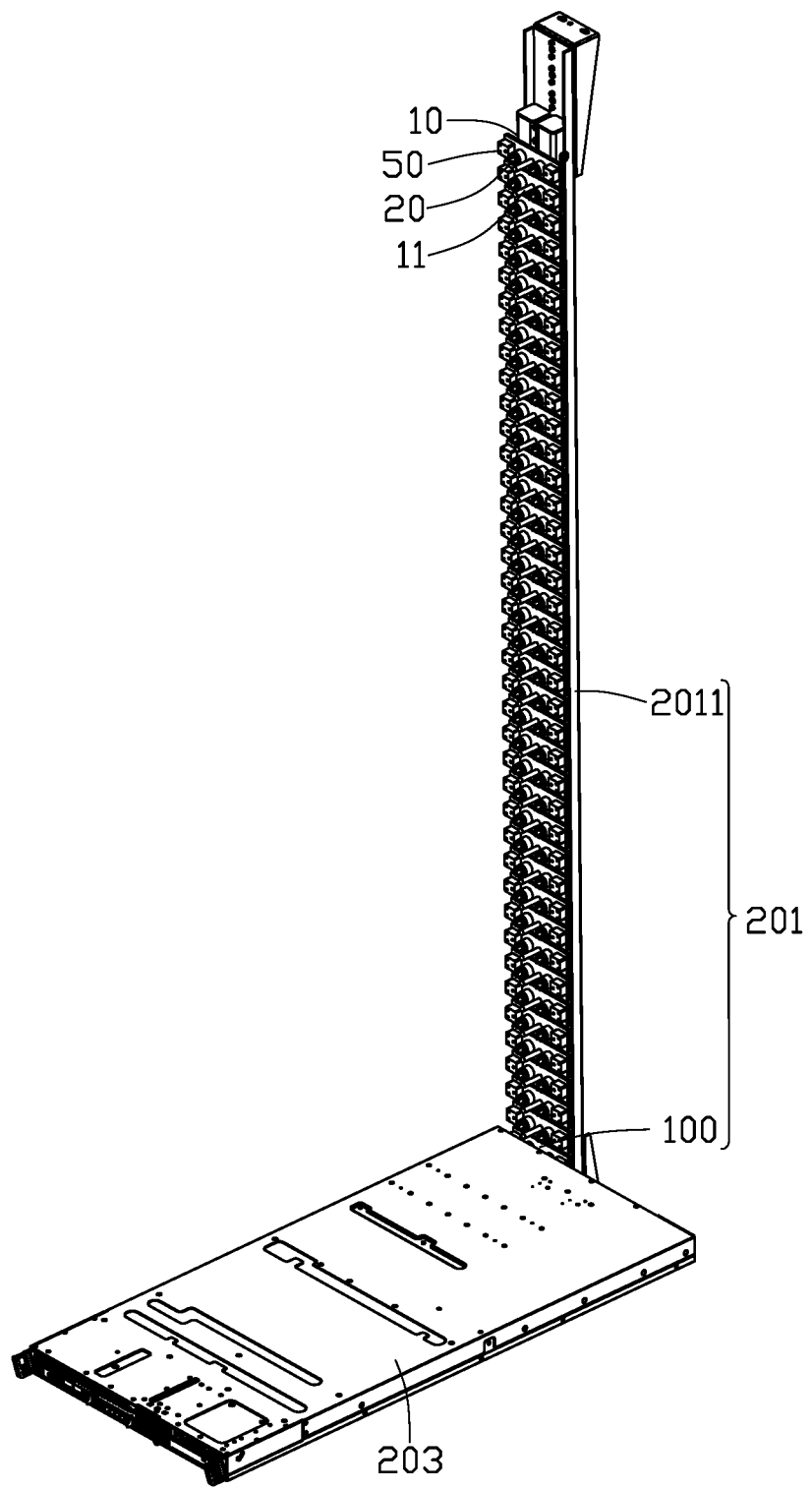
FIG. 2 is an isometric, assembled view of the server shown in FIG. 1, the server body being installed in a cabinet body when a part of the cabinet body is removed.

As show in FIG. 1 and FIG. 2, an embodiment provides a server 200. The server 200 includes a liquid cooling cabinet 201 and a server body 203. The liquid cooling cabinet 201 includes a cabinet body 2011 and a liquid cooling structure 100. The server body 203 is detachably installed in the cabinet body 2011. The liquid cooling structure 100 is used to cool the heat-generating elements in the server body 203.

Figure 3:
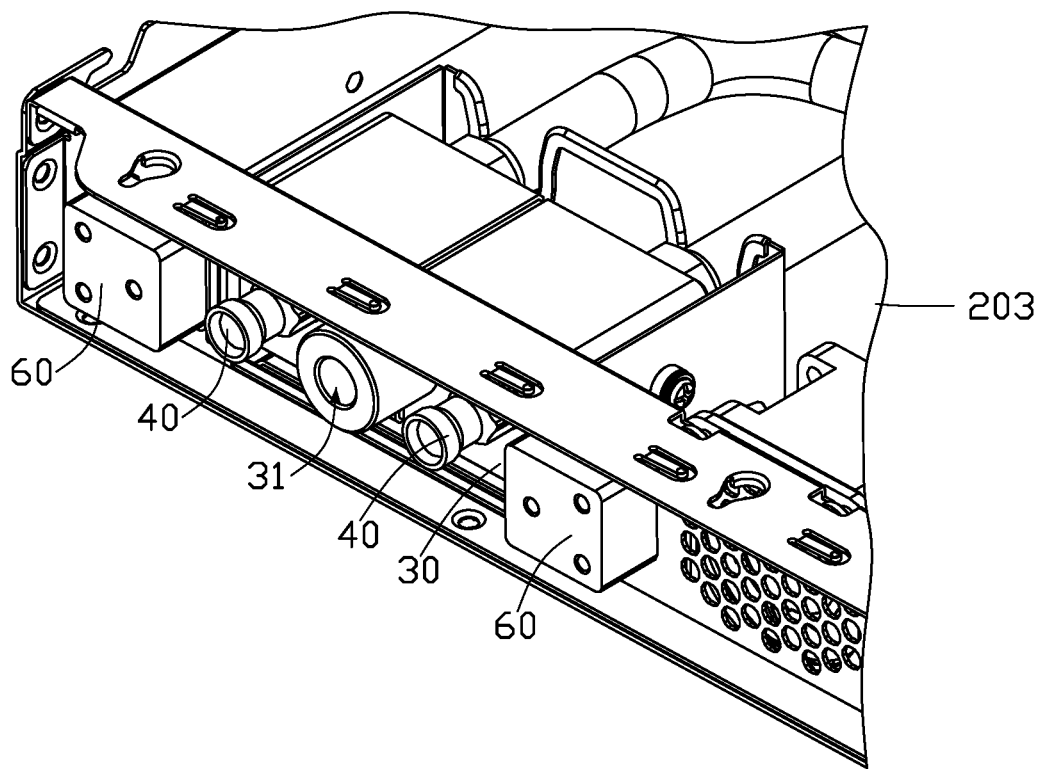
FIG. 3 is an isometric, assembled view of the server body and a liquid cooling structure in the server shown in FIG. 2.
Figure 4:
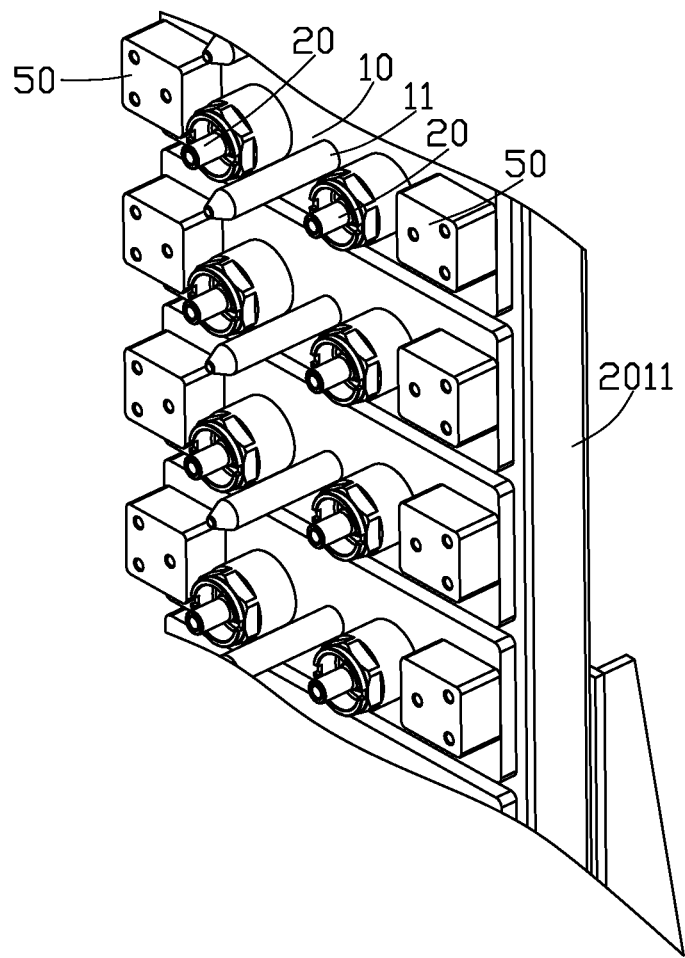
FIG. 4 is an isometric, assembled view of the cabinet body and a liquid cooling structure in the server shown in FIG. 2.

As shown in FIG. 3 and FIG. 4, the liquid cooling structure 100 includes a first support 10, a first joint 20, a second support 30, a second joint 40, a first magnet 50, and a second magnet 60. The first support 10 is set on the cabinet body 2011. The second support 30 is set on the server body 203. The first joint 20 is arranged on the first support 10. The second joint 40 is arranged on the second support 30. The second joint 40 is to match with the first joint 20. The first magnet 50 is arranged on the first support 10, and located at one side of the first joint 20. The second magnet 60 is arranged on the second support 30, and located on one side of the second joint 40. The first magnet 50 is aligned with the second magnet 60, and the first magnet 50 is a polar opposite of the second magnet 60.

When the first joint 20 and the second joint 40 are plugged together, the first magnet 50 and the second magnet 60 attract each other to provide attraction between the first joint 20 and the second joint 40, which reduces the external force for the insertion and saves labor for installing the liquid cooling structure 100.

In an embodiment, the number of the server body 203 and that of the liquid cooling structure 100 are multiple and equal. The server bodies 203 are detachably installed in the cabinet body 2011. Each liquid cooling structure 100 cools the heat-generating elements of one server body 203.

In an embodiment, the first joint 20 is the male joint of the quickseal joint, and the second joint 40 is the female joint of the quickseal joint. When the male joint is inserted into the female joint, the female joint provides elastic force to lock with the male joint, and the elastic force is opposite to the force for insertion. When the first joint 20 and the second joint 40 are brought together, the external force for insertion as in prior art needs to overcome the elastic force. In this embodiment, part of the elastic force which represents a resistance is offset if not overcome by the attractive force between the first magnet 50 and the second magnet 60, providing power for the insertion and reducing the external force used for the insertion.

In another embodiment, the first joint 20 is a female joint of the quick joint, and the second joint 40 is a male joint of a quick joint.

Figure 5:
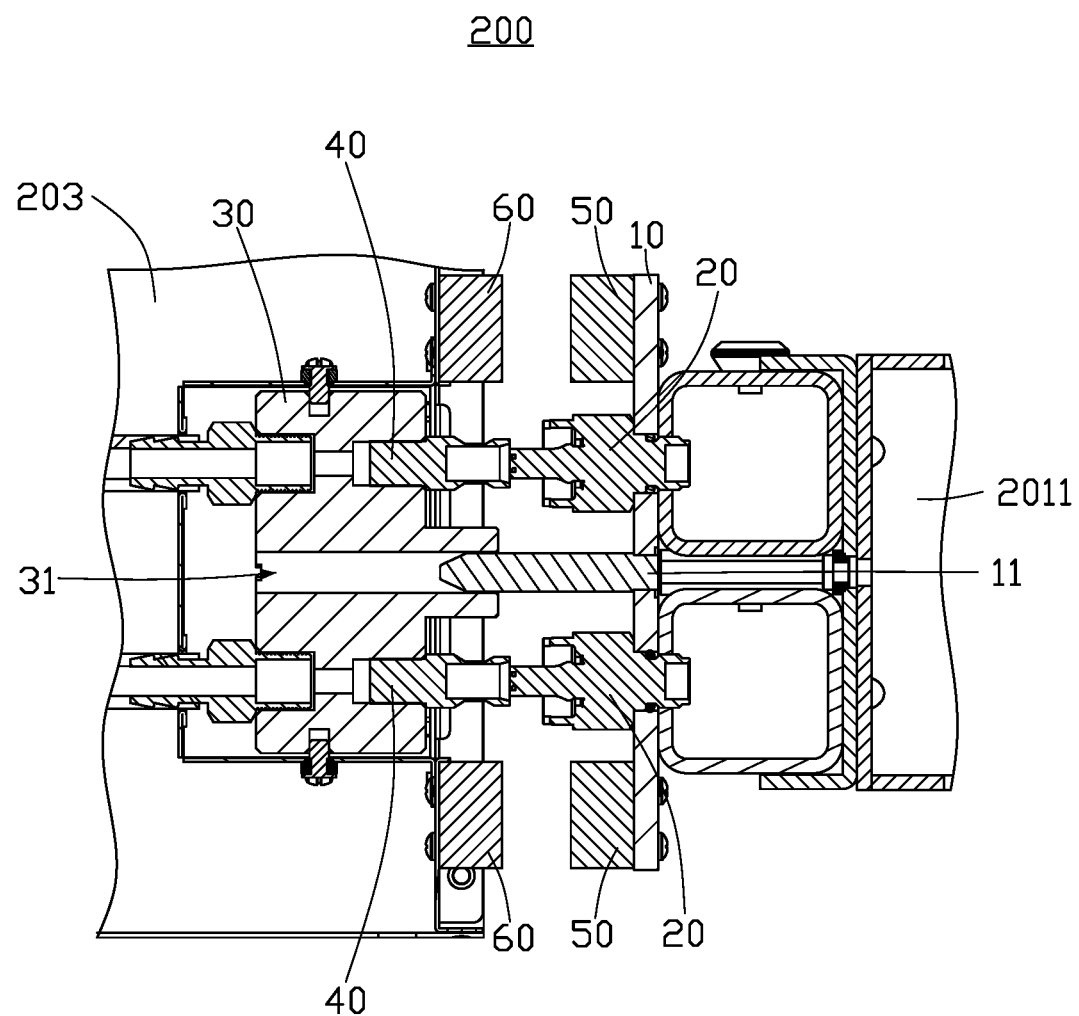
FIG. 5 is an isometric, sectional view of the liquid cooling structure before a first joint and a second joint are connected.
Figure 6:
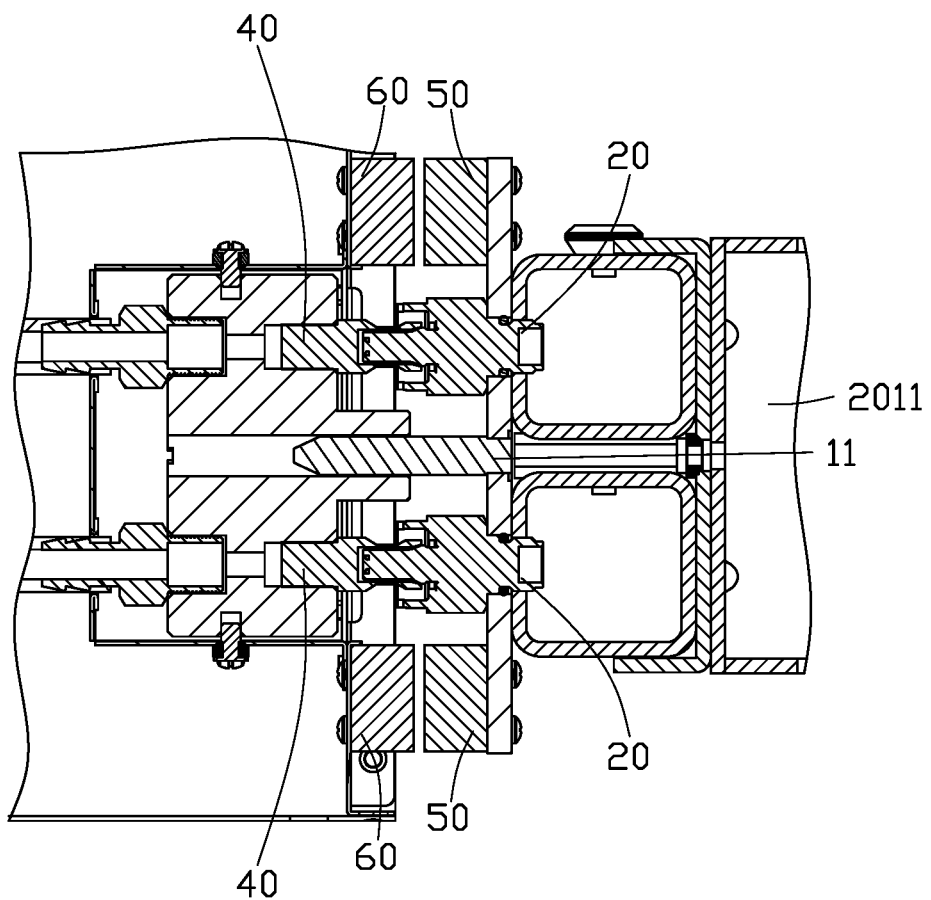
FIG. 6 is an isometric, sectional view of the liquid cooling structure when the first and second joints are connected.

As shown in FIG. 5 and FIG. 6, there are two first joints 20 and two second joints 40. In an embodiment, two first joints 20 are arranged on the first support 10, and two second joints 40 are arranged on the second support 30.

One of the first joints 20 and one of the second joints 40 are coupled for the input of cooling liquid, and the other first joint 20 and the other second joint 40 are coupled for the output of the liquid after cooling the heating elements. In an embodiment, the liquid is water. In other embodiments, the liquid may be other cooling liquid.

In other embodiments, one first joint 20 and one second joint 40 are arranged on the first support 10, and another first joint 20 and another second joint 40 are arranged on the second support 30.

There are two first magnet 50s. The two first magnets 50 are located outside the two first joints 20. There are two second magnets 60. The two second magnets 60 are located outside the two second joints 40.

In other embodiments, the number of the first and second magnets 50 and 60 may be one or more than two.

In other embodiments, the first magnet 50 and the second magnet 60 may be located at other positions of the first joint 20 and the second joint 40. For example, the first magnet 50 can be arranged between the two first joints 20.

In an embodiment, the first magnet 50 and the second magnet 60 are structures which are magnetic. The first magnet 50 and the second magnet 60 are simple in structure, low in cost, and easy to install. The first magnet 50 and the second magnet 60 are connected to the first support 10 or the second support 30 by bonding or by fasteners such as rivets.

In other embodiments, one of the first and second magnets 50 and 60 is a permanent magnet, and the other is a magnetizable metal structure.

The first magnet 50 has the same shape as the second magnet 60. Along the direction of the first joint 20 inserted into the second joint 40, the projections of the first magnet 50 and the second magnet 60 are coincident. The magnetic attraction force between the first magnet 50 and the second magnet 60 is evenly distributed, and the direction of the magnetic attraction force is parallel to the direction of insertion, so as to aid in aligning the first joint 20 and the second joint 40 for coupling.

In another embodiment, the shape of the first magnet 50 and that of the second magnet 60 may be different. The first joint 20 and the second joint 40 are aligned by the guide structure. For example, as shown in FIG. 5, the first support 10 is provided with a guide part 11, and a hole 31 is defined in the second support 30. The guide part 11 may be inserted into the hole 31 and can slide in the hole 31. The guide part 11 and the hole 31 constitute a guide structure for the first joint 20 and the second joint 40 to be coupled.

In another embodiment, a hole 31 can be defined in the first support 10, and a guide part 11 can be set on the second support 30.

The number of guide part 11 and the hole 31 is one of each. The guide part 11 is located between the two first joints 20, and the hole 31 is located between the two second joints 40.

The guide part 11 is inserted into the hole 11, and the first joint 20 is aligned with the second joint 40 under the mutual attraction of the first magnet 50 and the second magnet 60.

When the first magnet 50 and the second magnet 60 are omitted, the first support 10 and the second support 30 can rotate relative to each other so that the first joint 20 and the second joint 40 can be aligned.

In other embodiment, the number of guide parts 11 and holes 31 can be two. Each guide part 11 is inserted and matches with a hole 31, and the first joint 20 and the second joint 40 can be aligned without the attraction of the first magnet 50 and the second magnet 60.

As shown in FIG. 5, when the first joint 20 and the second joint 40 are coupled, a distance is defined between the first magnet 50 and the second magnet 60 along the direction of insertion. The first magnet 50 and the second magnet 60 are not touching. The magnetic attraction force when the first magnet 50 and the second magnet 60 are separated is smaller than the magnetic attraction force when the first magnet 50 and the second magnet 60 are together. When the first joint 20 and the second joint 40 are disconnected, the direction of the magnetic attraction force is opposite to the separation direction, but the magnetic attraction force will become smaller as the distance between the first magnet 50 and the second magnet 60 becomes larger, and the first joint 20 and the second joint 40 are in the opposite direction. The elastic force between the first joint 20 and the second joint 40 will still provide power to release the first magnet 50 and the second magnet 60 against any magnetic force, so as to reduce the external force required to release or reduce the attraction between the first magnet 50 and the second magnet 60.

The overlapping area of the projection of the first magnet 50 along the insertion direction and the projection of the second magnet 60 along the insertion direction is greater than a predetermined value, so that the magnetic attraction force between the first magnet 50 and the second magnet 60 is evenly distributed, and most of the external force for coupling is offset, and the first magnet 50 and the second magnet 60 move stably along the insertion direction.

For example, when the liquid cooling structure 100 does not have the first magnet 50 and the second magnet 60, the external force required for overcoming the elastic force measured by a push-pull force meter is 2 Kg. When the liquid cooling structure 100 includes the first magnet 50 and the second magnet 60, the required external force for coupling the first joint 20 and the second joint 40 measured by the push-pull force meter is 0.4 Kg, and the external force measured for separating the first joint 20 and the second joint 40 is 0.2 Kg. When the liquid cooling structure 100 includes the first magnet 50 and the second magnet 60, the external forces for coupling and for separating the first joint 20 and the second joint 40 are much less than those required when the first magnet 50 and the second magnet 60 are omitted.

In the cooling structure 100 and the server 200, the first magnet 50 and second magnet 60 with opposite magnetism attract each other to provide power for the coupling of the first joint 20 and the second joint 40, and reduce the external force required, so that the installation of the liquid cooling structure 100 is labor-saving.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:

1. A liquid cooling structure comprising:
a first support;
at least one first joint positioned on the first support;
a second support;
at least one second joint arranged on the second support, the second joint being configured to match with the first joint;
at least one first magnet positioned on the first support; and
at least one second magnet positioned on the second support, wherein a polarity of the first magnet is opposite to a polarity of the second magnet;
wherein when the first joint and the second joint are plugged together, the first magnet and the second magnet do not come into contact with each other.

2. The liquid cooling structure of claim 1, wherein:
the first magnet and the second magnet have a same shape, and projections of the first magnet and the second magnet along a direction of the first joint plugging into the second joint overlap.

3. The liquid cooling structure of claim 2, wherein:
an overlapping area of the projections of the first magnet and the second magnet along the insertion direction is greater than a predetermined value.

4. The liquid cooling structure of claim 1, wherein:
one of the first support and the second support is provided with a guide part, and a hole is defined in the other one of the first support and the second support; and
the guide part is insertable and slidable inside the hole.

5. The liquid cooling structure of claim 1 comprising two first joint and two second joint, wherein one of the two first joints and one of the two second joints are coupled together and configured for receiving liquid, and the other first joint and the other second joint are coupled together and configured for outputting liquid.

6. The liquid cooling structure of claim 5 comprising two first magnets and two second magnets, wherein:
the two first magnets are located outside the ends of the two first joints;
the two second magnets are located outside the ends of the two second joints.

7. The liquid cooling structure of claim 5, wherein:
one of the first support and the second support is provided with a guide part, and a hole is defined in the other one of the first support and the second support;
the guide part is inserted into the hole, and slidable inside the hole.

8. The liquid cooling structure of claim 1, wherein:
the first joint is a male joint, and the second joint is a female joint;
the first joint and the second joint are locked by an elastic force.

9. A liquid cooling cabinet comprising:
a cabinet body; and
a liquid cooling structure, wherein:
the liquid cooling structure comprises:
a first support;
at least one first joint positioned on the first support;
a second support;
at least one second joint positioned on the second support; and the second joint is inserted and matched with the first joint;
at least one first magnet positioned on the first support; and
at least one second magnet positioned on the second support, and a polarity of the first magnet is opposite to a polarity of the second magnet;
the first support or the second support is arranged on the cabinet body;
wherein when the first joint and the second joint are plugged together, the first magnet and the second magnet do not come into contact with each other.

10. A server comprising:
a cabinet body,
a server body; and
a liquid cooling structure, wherein:
the liquid cooling structure comprises:
a first support;
at least one first joint positioned on the first support;
a second support;
at least one second joint arranged on the second support; and the second joint is matched with the first joint;
at least one first magnet positioned on the first support; and
at least one second magnet positioned on the second support, and a polarity of the first magnet is opposite to a polarity of the second magnet;
one of the first support and the second support is positioned on the cabinet body, and the other is positioned on the server body;
wherein when the first joint and the second joint are plugged together, the first magnet and the second magnet do not come into contact with each other.

11. The server of claim 10, wherein:
the first magnet and the second magnet have a same shape, and projections of the first magnet and the second magnet along a direction of the first joint plugging into the second joint are overlap.

12. The server of claim 11, wherein:
an overlapping area of the projections of the first magnet and the second magnet along the insertion direction is greater than a predetermined value.

13. The server of claim 10, wherein:
one of the first support and the second support is provided with a guide part, and a hole is defined in the other one of the first support and the second support;
the guide part can be insertable into the hole and slidable inside the hole.

14. The server of claim 10 comprising two first joints and two second joints, wherein:
one of the first joints and one of the second joints are coupled together for receiving liquid, and the other first joint and the other second joint are coupled together and configured for outputting liquid.

15. The server of claim 14 comprising two first magnets and two second magnets, wherein:
the two first magnets are located outside the ends of the two first joints;
the two second magnets are located outside the ends of the two second joints.

16. The server of claim 15, wherein:
one of the first support and the second support is provided with a guide part, and a hole is defined in the other of the first support and the second support;
the guide part can be inserted into the hole, and slidable inside the hole.

17. The server of claim 10, wherein:
the first joint is a male joint, and the second joint is a female joint;
the first joint and the second joint are locked by an elastic force.

* * * * *